(12) United States Patent
Noda

(10) Patent No.: US 11,961,703 B2
(45) Date of Patent: Apr. 16, 2024

(54) MULTIPLE ELECTRON-BEAM IMAGE ACQUISITION APPARATUS AND MULTIPLE ELECTRON-BEAM IMAGE ACQUISITION METHOD USING BEAM ARRANGEMENT WITH OMITTED CORNERS IN A SCAN DIRECTION

(71) Applicant: NuFlare Technology, Inc., Yokohama (JP)

(72) Inventor: Chosaku Noda, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 251 days.

(21) Appl. No.: 16/904,798

(22) Filed: Jun. 18, 2020

(65) Prior Publication Data

US 2020/0411280 A1 Dec. 31, 2020

(30) Foreign Application Priority Data

Jun. 28, 2019 (JP) .................................. 2019-121985

(51) Int. Cl.
*H01J 37/317* (2006.01)
*H01J 37/063* (2006.01)
*H01J 37/10* (2006.01)
*H01J 37/28* (2006.01)

(52) U.S. Cl.
CPC ............ *H01J 37/28* (2013.01); *H01J 37/063* (2013.01); *H01J 37/10* (2013.01); *H01J 37/3177* (2013.01); *H01J 2237/2817* (2013.01); *H01J 2237/31774* (2013.01)

(58) Field of Classification Search
CPC .................................................. H01J 37/3177
See application file for complete search history.

(56) References Cited

U.S. PATENT DOCUMENTS

| 7,244,949 | B2 | 7/2007 | Knippelmeyer et al. |
| 7,554,094 | B2 | 6/2009 | Knippelmeyer et al. |
| 8,097,847 | B2 | 1/2012 | Knippelmeyer et al. |
| 8,637,834 | B2 | 1/2014 | Knippelmeyer et al. |
| 9,224,576 | B2 | 12/2015 | Knippelmeyer et al. |
| 9,390,886 | B2 | 7/2016 | Nakasuji et al. |
| 9,673,024 | B2 | 6/2017 | Knippelmeyer et al. |

(Continued)

FOREIGN PATENT DOCUMENTS

| JP | 2004-200549 A | 7/2004 |
| JP | 2006-226833 A | 8/2006 |

(Continued)

OTHER PUBLICATIONS

Japanese Office Action dated Nov. 18, 2022, issued in Japanese Application No. 2019-121985 (with English translation).

*Primary Examiner* — James Choi
(74) *Attorney, Agent, or Firm* — Oblon, McClelland, Maier & Neustadt, L.L.P.

(57) ABSTRACT

A beam arrangement portion is provided to arrange multiple primary electron beams on a substrate. The beam arrangement portion arranges the multiple primary electron beams in a square lattice along a first moving direction of a stage allowing the substrate to be placed thereon and a second moving direction perpendicular to the first moving direction in a state where, when the multiple primary electron beams are viewed as a whole, beams around four corners of the square lattice are omitted.

12 Claims, 8 Drawing Sheets

(56) References Cited

U.S. PATENT DOCUMENTS

| | | | |
|---|---|---|---|
| 9,934,943 | B2 | 4/2018 | Kuiper et al. |
| 10,504,681 | B2 | 12/2019 | Knippelmeyer et al. |
| 2006/0289804 | A1 | 12/2006 | Knippelmeyer et al. |
| 2008/0054184 | A1 | 3/2008 | Knippelmeyer et al. |
| 2010/0181479 | A1 | 7/2010 | Knippelmeyer et al. |
| 2010/0213370 | A1 | 8/2010 | Nakasuji et al. |
| 2012/0026272 | A1 | 2/2012 | Katzir et al. |
| 2012/0104252 | A1 | 5/2012 | Knippelmeyer et al. |
| 2014/0158902 | A1 | 6/2014 | Knippelmeyer et al. |
| 2016/0071696 | A1 | 3/2016 | Kuiper et al. |
| 2016/0111251 | A1 | 4/2016 | Knippelmeyer et al. |
| 2017/0287674 | A1 | 10/2017 | Knippelmeyer et al. |
| 2018/0031498 | A1* | 2/2018 | Shiratsuchi ............. H01J 37/22 |
| 2018/0060474 | A1* | 3/2018 | Hara ................... H01J 37/3177 |
| 2018/0254167 | A1* | 9/2018 | Zhao ....................... H01J 37/28 |
| 2019/0259572 | A1 | 8/2019 | Noda et al. |

FOREIGN PATENT DOCUMENTS

| | | |
|---|---|---|
| JP | 2007-513460 A | 5/2007 |
| JP | 2012-527006 A | 11/2012 |
| JP | 2016-522572 A | 7/2016 |
| JP | 2017-139458 A | 8/2017 |
| JP | 2019-144109 A | 8/2019 |

* cited by examiner

MULTIPLE ELECTRON-BEAM IMAGE ACQUISITION APPARATUS AND MULTIPLE ELECTRON-BEAM IMAGE ACQUISITION METHOD USING BEAM ARRANGEMENT WITH OMITTED CORNERS IN A SCAN DIRECTION

CROSS-REFERENCE TO RELATED APPLICATIONS

This application is based upon and claims the benefit of priority from Japanese Patent Application No. 2019-121985, filed on Jun. 28, 2019, the entire contents of which are incorporated herein by reference.

FIELD

The embodiments of the present invention relate to a multiple electron-beam image acquisition apparatus and a multiple electron-beam image acquisition method.

BACKGROUND

As a large-scale integrated circuit (LSI) is more highly integrated and the capacity of the LSI is increased in recent years, the linewidth required in a semiconductor element is becoming narrower. In manufacturing of an LSI that requires a huge manufacturing cost, it is necessary to improve the yield. However, a pattern that forms an LSI is of the order of sub-microns to nanometers, as represented by a 1-Gb class DRAM (dynamic random access memory). In recent years, the dimension that has to be detected as a pattern defect becomes very small in association with downscaling of the dimension of an LSI pattern formed on a semiconductor wafer. Therefore, it is necessary to improve accuracy of a pattern inspection apparatus that performs inspection of a defect in an ultra-fine pattern transferred onto the semiconductor wafer. In addition, one of major factors of lowering the yield is a pattern defect in a mask used in exposure and transfer of the ultra-fine pattern onto the semiconductor wafer by photolithography. Therefore, it is necessary to improve accuracy of a pattern inspection apparatus that performs inspection of a defect in a transfer mask used in manufacturing LSIs.

As an inspection method, there is known a method that performs inspection by comparing a measured image in which a pattern formed on a substrate such as a semiconductor wafer or a lithography mask is captured and a measured image in which design data or the same pattern on the substrate is captured with each other. Examples of the pattern inspection method are "die to die inspection" that compares plural pieces of measured image data in which plural pieces of the same pattern at different positions on the same substrate are captured with each other and "die to database inspection" that generates design image data (a reference image) based on design data used for pattern design and compares the generated design image data and a measured image that is measured data in which a pattern is captured with each other. A captured image is sent to a comparison circuit as the measured data. The comparison circuit positionally aligns the images with each other and then compares the measured data and the reference data with each other in accordance with an appropriate algorithm. When the measured data and the reference data do not match each other, the comparison circuit determines that there is a pattern defect.

As the pattern inspection apparatus described above, an apparatus that radiates laser light onto a substrate to be inspected and captures a transmission image or a reflected image is being developed, and another inspection apparatus is also being developed which scans a substrate to be inspected with an electron beam, and detects secondary electrons emitted from the substrate to be inspected in association with radiation of the electron beam to acquire a pattern image. As the inspection apparatus using an electron beam, an apparatus that uses multibeams is also being developed.

SUMMARY

However, in a case where multibeams are arranged in a rectangle as a whole in the inspection apparatus using the multibeams, beams at four corners are apart from the center of the multibeams. Therefore, the field of view (FOV) is large, resulting in disadvantages of convergence and distortion of the beams. Meanwhile, an inspection region cannot be scanned with the multibeams without excess or deficiency only by simply making the beams at four corners ineffective. In a case where the field of view is large or a case where the inspection region cannot be scanned without excess or deficiency as described above, it is difficult to improve accuracy and efficiency of inspection.

It is an object of the present invention to provide a multiple electron-beam image acquisition apparatus and a multiple electron-beam image acquisition method that can improve accuracy and efficiency of inspection.

A multiple electron-beam image acquisition apparatus according to an aspect of the present invention is a multiple electron-beam image acquisition apparatus radiating multiple primary electron beams onto a substrate and acquiring an image of multiple secondary electron beams emitted from the substrate, and comprises a beam arrangement portion configured to arrange the multiple primary electron beams on the substrate, wherein the beam arrangement portion arranges the multiple primary electron beams in a square lattice along a first moving direction of a stage allowing the substrate to be placed thereon and a second moving direction perpendicular to the first moving direction in a state where, when the multiple primary electron beams are viewed as a whole, beams around four corners of the square lattice are omitted.

It is possible that, in the multiple electron-beam image acquisition apparatus described above, the beam arrangement portion arranges the multiple primary electron beams in such a state where when the first moving direction is defined as a column-arranged direction and the second moving direction is defined as a row-arranged direction, a sum of the number of beams in a K-th row and the number of beams in a (N−A+K)-th row is M, where M is the number of columns of beams forming the multiple primary electron beams, N is the number of rows of the beams forming the multiple primary electron beams, A is ½ of the number of rows in which the number of beams in the column-arranged direction is smaller than M, and K is any integer that is equal to or larger than one and is equal to or smaller than A.

It is possible that, in the multiple electron-beam image acquisition apparatus described above, the beam arrangement portion arranges the multiple primary electron beams in 180° rotational symmetry.

It is possible that, in the multiple electron-beam image acquisition apparatus described above, the beam arrangement portion includes an aperture member having a plurality of openings formed therein, and the openings are provided in line in a square lattice along the first moving direction and the second moving direction and, when the openings are viewed as a whole, openings around four corners of the square lattice are omitted.

A multiple electron-beam image acquisition method according to another aspect of the present invention is a multiple electron-beam image acquisition method radiating multiple primary electron beams onto a substrate and acquiring an image of multiple secondary electron beams emitted from the substrate, and comprises arranging the multiple primary electron beams on the substrate in a square lattice along a first moving direction of a stage allowing the substrate to be placed thereon and a second moving direction perpendicular to the first moving direction in a state where, when the multiple primary electron beams are viewed as a whole, beams around four corners of the square lattice are omitted.

According to the present invention, it is possible to improve accuracy and efficiency of inspection.

DETAILED DESCRIPTION

Figure 1:
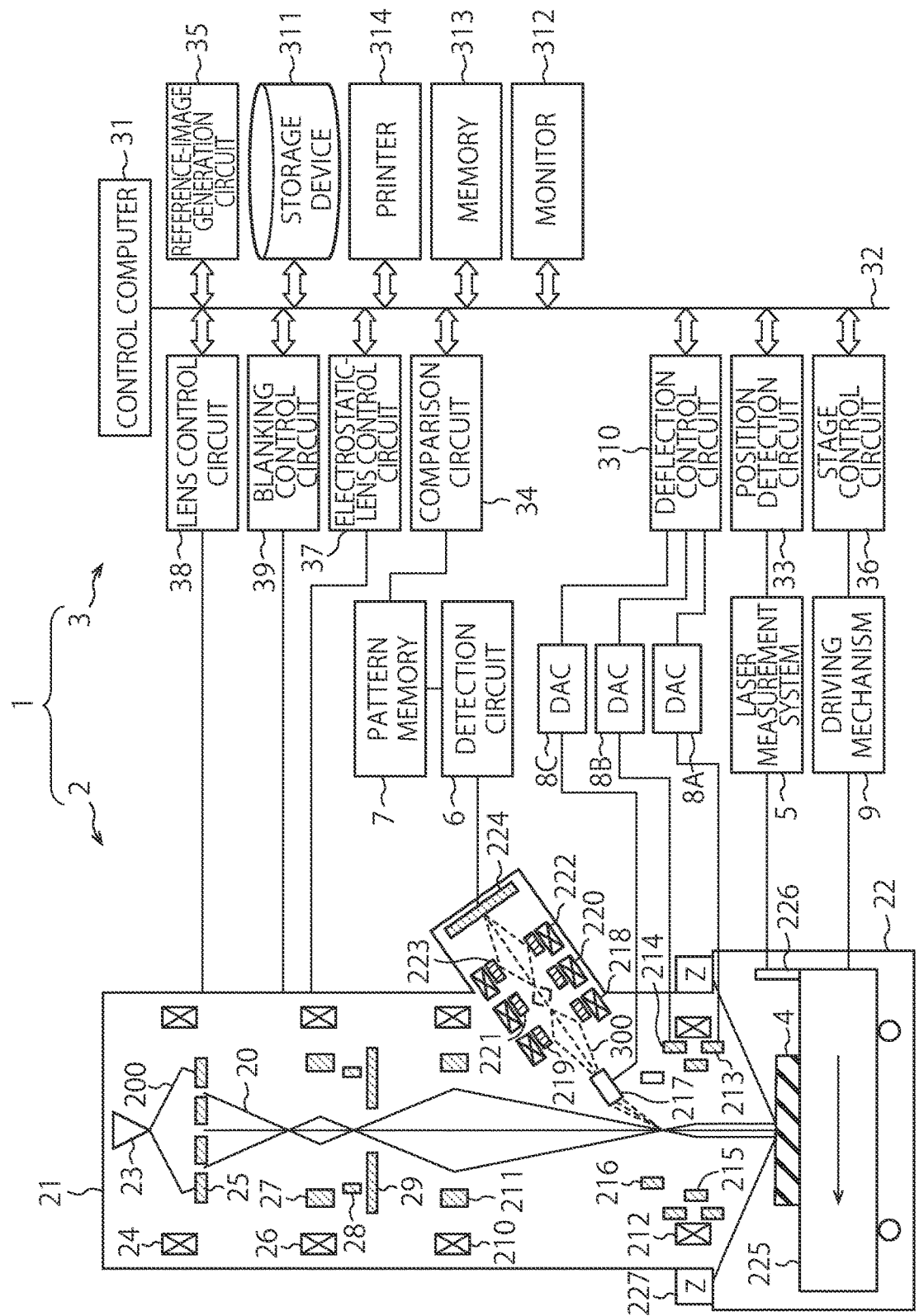
FIG. 1 is a diagram illustrating an example of a pattern inspection apparatus according to the present embodiment.

Embodiments of the present invention will be described below with reference to the drawings. These embodiments do not limit the present invention. In the drawings referred to in the embodiments, like parts or parts having identical functions are denoted by like or similar reference signs and redundant explanations thereof are omitted.

(Pattern Inspection Apparatus)

In the following embodiment, a pattern inspection apparatus that performs inspection for a pattern formed on a substrate by using multiple electron beams is described as an example of a multiple electron-beam image acquisition apparatus.

FIG. 1 is a diagram illustrating an example of a pattern inspection apparatus 1 according to the present embodiment.

The pattern inspection apparatus 1 includes an image acquisition mechanism 2 and a control-system circuit 3. The image acquisition mechanism 2 includes an electron-beam column 21 (that is, an electronic lens barrel) and an inspection chamber 22. An electron gun 23 (that is, an emission source), an electromagnetic lens 24, a shaping-aperture array substrate 25 that is an example of a beam arranging portion and an aperture member, an electromagnetic lens 26, an electrostatic lens 27, a collective blanking deflector 28, a limiting-aperture substrate 29, an electromagnetic lens 210, an electrostatic lens 211, and an electromagnetic lens 212 (that is, an objective lens) are arranged in the electron-beam column 21. Further, a main deflector 213, a sub-deflector 214, an electrostatic lens 215, a beam separator 216, a deflector 217, an electromagnetic lens 218, an electrostatic lens 219, an electromagnetic lens 220, an electrostatic lens 221, an electromagnetic lens 222, an electrostatic lens 223, and a multidetector 224 are arranged in the electron-beam column 21.

A stage 225 that can move at least in the X, Y, and Z-directions is arranged in the inspection chamber 22. A substrate 4 that is to be inspected (that is, a sample) can be placed on the stage 225. Examples of the substrate 4 include a mask substrate for exposure and a semiconductor substrate such as a silicon wafer. In a case where the substrate 4 is a semiconductor substrate, a plurality of chip patterns (that is, wafer dies) are formed on the semiconductor substrate. In a case where the substrate 4 is a mask substrate for exposure, a chip pattern is formed on the mask substrate for exposure. The chip pattern is configured by a plurality of figure patterns. Exposure is performed multiple times to transfer the chip pattern formed on the mask substrate for exposure onto a semiconductor substrate, so that a plurality of chip patterns are formed on the semiconductor substrate. The substrate 4 is arranged on the stage 225, for example, with its pattern-formed surface facing up. Further, a mirror 226 is arranged on the stage 225, which reflects laser light for laser measurement radiated from a laser measurement system 5 arranged outside the inspection chamber 22. Furthermore, a height-position sensor (that is, a Z sensor) 227 that measures the height position of a surface of the substrate 4 is arranged on the inspection chamber 22. The Z sensor 227 radiates laser light to the surface of the substrate 4 from diagonally above by using a floodlight, receives reflected light of the radiated laser light by using a light receiver, and measures the height position of the surface of the substrate 4 by using the reflected light that is received. The multidetector 224 is connected to a detection circuit 6 outside the electron-beam column 21. The detection circuit 6 is connected to a pattern memory 7.

In the control-system circuit 3, a control computer 31 that controls the overall pattern inspection apparatus 1 is connected to a position detection circuit 33, a comparison circuit 34, a reference-image generation circuit 35, a stage control circuit 36, an electrostatic-lens control circuit 37, a lens control circuit 38, a blanking control circuit 39, a deflection control circuit 310, a storage device 311 such as a magnetic disk device, a monitor 312, a memory 313, and a printer 314 via a bus 32. The deflection control circuit 310 is also connected to DAC (digital-analog conversion) amplifiers 8A, 8B, and 8C. The DAC amplifier 8A is connected to the main deflector 213, the DAC amplifier 8B is connected to the sub-deflector 214, and the DAC amplifier 8C is connected to the deflector 217.

The pattern memory 7 is connected to the comparison circuit 34. The stage 225 is controlled by the stage control circuit 36 to be driven by a driving mechanism 9. The driving mechanism 9 includes a driving system, such as a three-axis motor, that drives the stage 225 in the x and y-directions (that is, the horizontal direction) and the θ-direction (that is, the rotational direction) in a stage coordinate system that is perpendicular to the optical axis of multiple primary electron beams, for example. A stepping motor can be used as the three-axis motor, for example. Further, the driving mechanism 9 can move the stage 225 in the Z-direction (that is, the height direction) by using a piezoelectric element, for example. The laser measurement system 5 receives reflected light from the mirror 226, thereby measuring the position of the stage 225 in accordance with the principle of laser interferometry, and supplies the measured moving position to the position detection circuit 33.

The electromagnetic lenses 24, 26, 210, 212, 218, 220, and 222 and the beam separator 216 are controlled by the lens control circuit 38. The collective blanking deflector 28 is configured by two or more electrodes, and each electrode is controlled by the blanking control circuit 39 via a DAC amplifier (not illustrated). Each of the electrostatic lenses 27, 211, 215, 219, 221, and 223 is configured by electrode substrates having an opening at the center in three or more stages, for example, and a middle-stage electrode substrate is controlled by the electrostatic-lens control circuit 37 via a DAC amplifier (not illustrated). An upper-stage electrode substrate and a lower-stage electrode substrate of each of the electrostatic lenses 27, 211, 215, 219, 221, and 223 are connected to the ground potential. The sub-deflector 214 is configured by four or more electrodes, and each electrode is controlled by the deflection control circuit 310 via the DAC amplifier 8B. The main deflector 213 is configured by four or more electrodes, and each electrode is controlled by the deflection control circuit 310 via the DAC amplifier 8A. The deflector 217 is configured by four or more electrodes, and each electrode is controlled by the deflection control circuit 310 via the DAC amplifier 8C.

A first electrostatic lens group formed by the three electrostatic lenses 27, 211, and 215 is arranged in a primary-electron optical system, that is, an illumination optical system. The electrostatic lens 27 is arranged in a magnetic field of the electromagnetic lens 26. The electrostatic lens 211 is arranged in a magnetic field of the electromagnetic lens 210. The electrostatic lens 215 is arranged in a magnetic field of the electromagnetic lens 212 that is an objective lens. A second electrostatic lens group formed by the three electrostatic lenses 219, 221, and 223 is arranged in a secondary-electron optical system, that is, a detection optical system. The electrostatic lens 219 is arranged in a magnetic field of the electromagnetic lens 218. The electrostatic lens 221 is arranged in a magnetic field of the electromagnetic lens 220. The electrostatic lens 223 is arranged in a magnetic field of the electromagnetic lens 222. For example, the middle-stage electrode substrate of the electrode substrates in three stages in each electrostatic lens is arranged at the height position of the center of the magnetic field or a lens principal plane of an electromagnetic lens corresponding to that electrostatic lens. Accordingly, a trajectory of an electron beam can be corrected by an electrostatic lens in a state where the moving speed of electrons is small because of a lens effect of an electromagnetic lens, in other words, in a state where the energy of electrons is small. Therefore, a potential applied to the middle-stage electrode substrate can be made low.

A high-voltage power-source circuit (not illustrated) is connected to the electron gun 23. In the electron gun 23, an acceleration voltage is applied between a filament (that is, a cathode, not illustrated) and an extraction electrode (that is, an anode) both arranged therein from the high-voltage power source circuit, a voltage is applied to another extraction electrode (that is, Wehnelt), and the filament is heated at a predetermined temperature. Accordingly, the electron gun 23 accelerates electrons emitted from the filament and emits the electrons as an electron beam 200.

Figure 2:
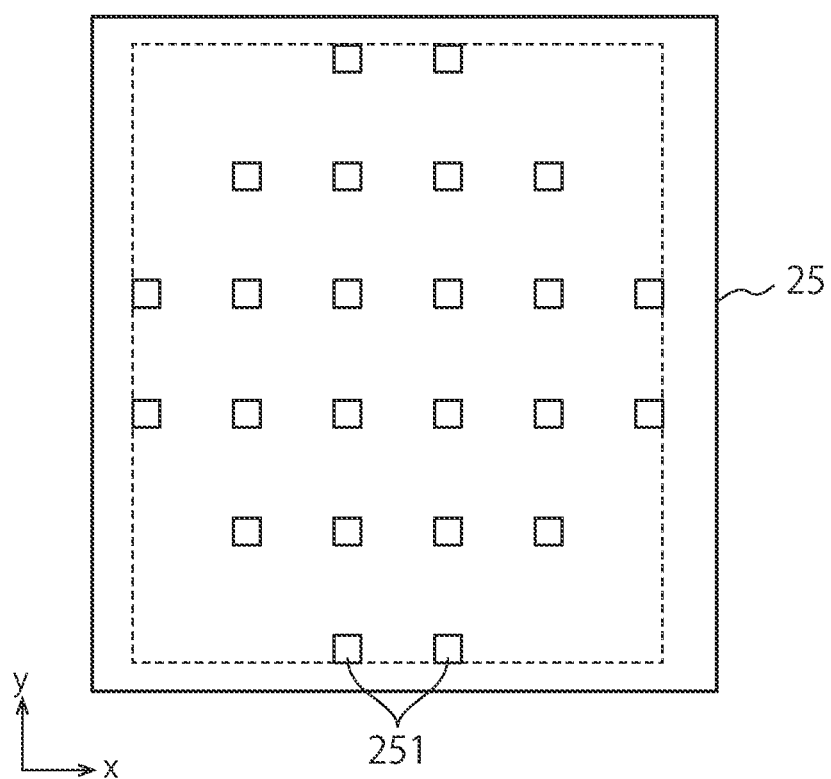
FIG. 2 is a plan view illustrating an example of a shaping-aperture array substrate in the pattern inspection apparatus according to the present embodiment.

FIG. 2 is a plan view illustrating an example of a shaping-aperture array substrate. In the example of FIG. 2, a plurality of holes (openings) 251 in six columns arranged in the horizontal direction (in the x-direction)×six rows arranged in the vertical direction (in the y-direction), i.e., arranged two-dimensionally are provided in the shaping-aperture array substrate 25.

The holes 251 are provided in line at a predetermined pitch along the x-direction that is along a first moving direction of the stage 225 and the y-direction that is along a second moving direction of the stage 225 perpendicular to the first moving direction, in a square lattice. In other words, the y-coordinates of the holes 251 adjacent to each other in the x-direction are the same as each other, and the x-coordinates of the holes 251 adjacent to each other in the y-direction are the same as each other.

Although the pitch in the x-direction of the holes 251 and the pitch in the y-direction are the same as each other in the example of FIG. 2, the pitch in the x-direction and the pitch in the y-direction may be different from each other.

Further, when the holes 251 are viewed as a whole, holes around four corners of the square lattice are omitted. In other words, no hole is formed around four corners of a rectangular region (see the broken-line portion in FIG. 2) surrounded by line segments along the y-direction that are circumscribed with the holes 251 at both ends in the x-direction and line segments along the x-direction that are circumscribed with the holes 251 at both ends in the y-direction.

Although the holes 251 are formed to have a rectangular shape with the same dimensions in the example of FIG. 2, those may be formed to have a circular shape with the same outer diameter. A portion of the electron beam 200 passes through the respective holes 251, so that multiple primary electron beams 20 are formed.

As illustrated in FIG. 2, the holes 251 are provided in a square lattice with its corners are cut. Therefore, the shaping-aperture array substrate 25 can arrange the multiple primary electron beams 20 in a square lattice along the first moving direction and the second moving direction of the stage 225 in a state where beams around four corners are omitted when the multiple primary electron beam 20 are viewed as a whole, as will be described later. Here, a square lattice means that the positions in the second moving direction (the y-coordinates) of beams of the multiple primary electron beams 20, which are adjacent to each other in the first moving direction (the x-direction), are the same as each other, and the positions in the first moving direction (the x-coordinates) of beams adjacent to each other in the second moving direction (the y-direction) are the same as each other. Therefore, a state where the positions in the second moving direction of the beams adjacent to each other in the first moving direction are shifted from each other and a state where the positions in the first moving direction of the beams adjacent to each other in the second moving direction are shifted from each other do not correspond to a square lattice.

Figure 4A:
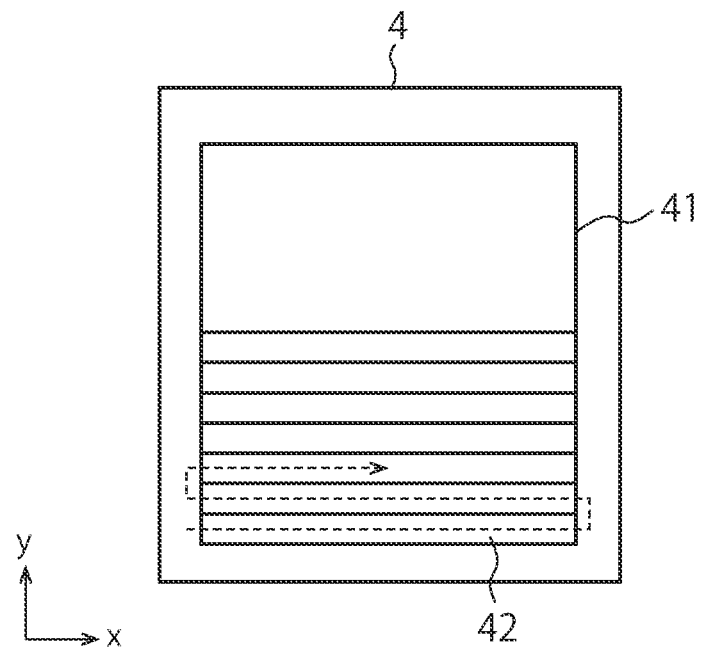
FIGS. 4A and 4B are plan views illustrating an inspection-target image acquisition step in the pattern inspection method according to the present embodiment.
Figure 4B:
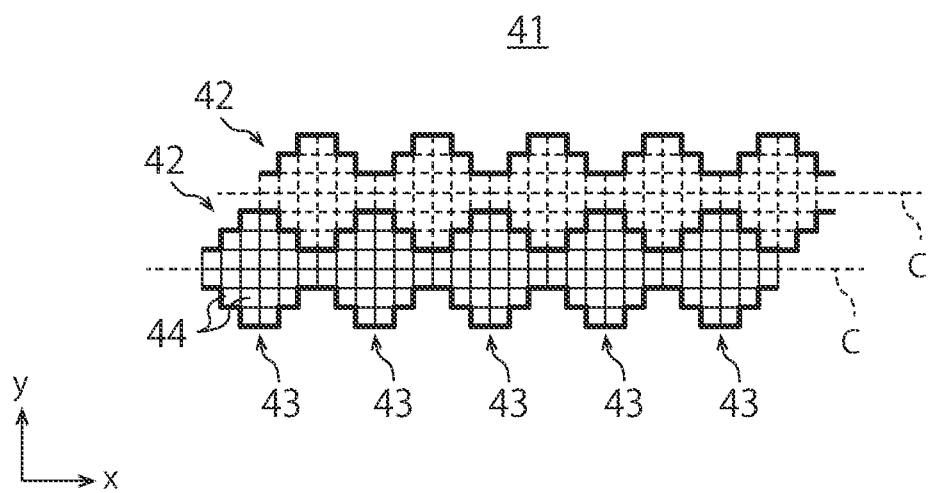

By scanning an inspection region of the substrate 4 along stripes 42 that have periodically varying widths, which will be described later with reference to FIGS. 4B and 7, with the multiple primary electron beams 20 arranged in the above-described manner, it is possible to scan the inspection region of the substrate 4 without excess or deficiency.

Next, an operation of the image acquisition mechanism 2 in the pattern inspection apparatus 1 is described.

The electron beam 200 emitted from the electron gun 23 is refracted by the electromagnetic lens 24, and is radiated onto the entire shaping-aperture array substrate 25. A portion of the electron beam 200 radiated onto the positions of the holes 251 in the shaping-aperture array substrate 25 passes through the holes 251, so that the multiple primary electron beams 20 are formed.

The formed multiple primary electron beams 20 are refracted by the electromagnetic lenses 26 and 210, pass through the beam separators 214 arranged at crossover positions of the respective multiple primary electron beams 20 while repeating forming intermediate images and crossover, and travel toward the electromagnetic lens 212. The electromagnetic lens 212 then focuses the multiple primary electron beams 20 onto the substrate 4. The multiple primary electron beams 20 focused (that is, brought into focus) on a surface of the substrate 4 by the electromagnetic lens 212 as an objective lens are collectively deflected by the main deflector 213 and the sub-deflector 214 and are radiated to radiation positions of the beams 20 on the substrate 4, respectively. By collectively deflecting all the multiple primary electron beams 20 by the collective blanking deflector 28, it is also possible to block a beam that is out of position from a hole at the center of the limiting-aperture substrate 29 by the limiting-aperture substrate 29.

When the multiple primary electron beams 20 are radiated to desired positions on the substrate 4, multiple secondary electron beams 300 as a bundle of secondary electrons including backscattered electrons corresponding to the respective multiple primary electron beams 20 are caused to be emitted from the substrate 4 by that radiation of the multiple primary electron beams 20.

The multiple secondary electron beams 300 emitted from the substrate 4 pass through the electromagnetic lens 212 and the electrostatic lens 215, and travel toward the beam separator 216.

The beam separator 216 generates an electric field and a magnetic field in directions that are perpendicular to each other on a plane perpendicular to a traveling direction of the center one of the multiple primary electron beams 20 (that is, the center axis of a trajectory). The electric field exerts a force in the same direction irrespective of a traveling direction of electrons. Meanwhile, the magnetic field exerts a force in accordance with Fleming's left-hand rule. Therefore, it is possible to change the direction of a force acting on electrons in accordance with an entering direction of the electrons. For the multiple primary electron beams 20 entering the beam separator 216 from above, the force by the electric field and the force by the magnetic field cancel out each other. Accordingly, the multiple primary electron beams 20 travel straight down. Meanwhile, for the multiple secondary electron beams 300 entering the beam separator 216 from below, the force by the electric field and the force by the magnetic field act in the same direction as each other. Accordingly, the multiple secondary electron beams 300 are deflected diagonally upward and are separated from the multiple primary electron beams 20.

The multiple secondary electron beams 300 deflected diagonally upward and separated from the multiple primary electron beams 20 are further deflected by the deflector 217, and are refracted by the electromagnetic lenses 218, 220, and 222 to be projected onto the multidetector 224. The multidetector 224 includes a diode-type two-dimensional sensor (not illustrated), for example. The multidetector 224 allows the multiple secondary electron beams 300 to collide with the two-dimensional sensor to generate electrons from the two-dimensional sensor, thereby detecting the projected multiple secondary electron beams 300 as two-dimensional electron-image data for each pixel. The multidetector 224 outputs the detected two-dimensional electron-image data to the detection circuit 6.

(Pattern Inspection Method)

Figure 3:
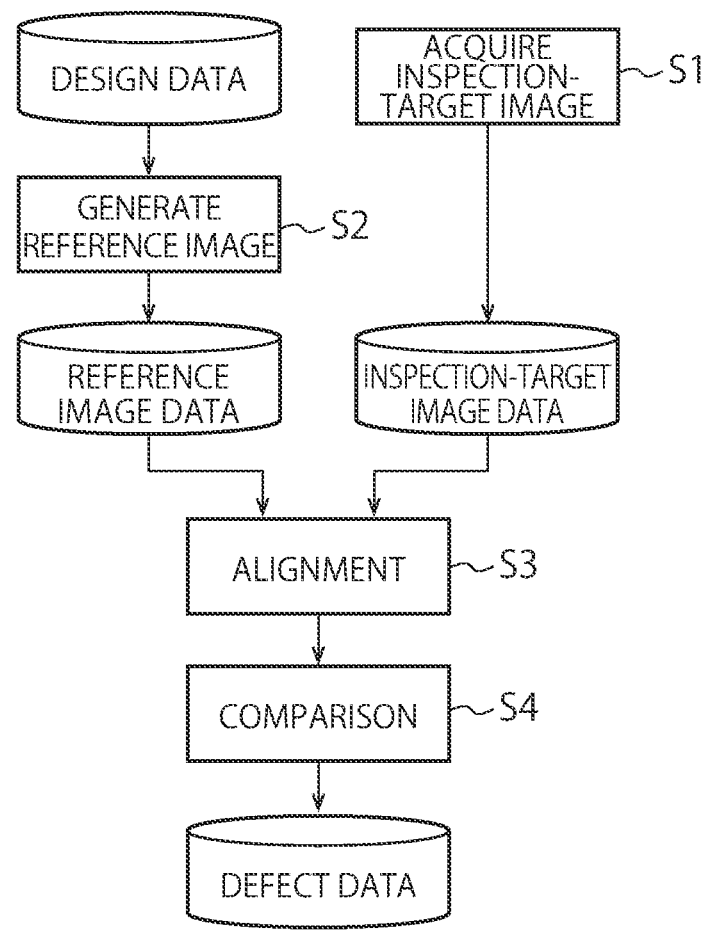
FIG. 3 is a flowchart illustrating a pattern inspection method according to the present embodiment.

Next, a pattern inspection method to which the pattern inspection apparatus 1 in FIG. 1 is applied is described. An example using a mask substrate for exposure as the substrate 4 is described below. FIG. 3 is a flowchart illustrating a pattern inspection method according to the present embodiment. FIG. 4A is a plan view illustrating an inspection-target image acquisition step in the pattern inspection method according to the present embodiment. FIG. 4B illustrates details of stripes. As illustrated in FIG. 3, the pattern inspection method includes the inspection-target image acquisition step (Step S1), a reference image generation step (Step S2), an alignment step (Step S3), and a comparison step (Step S4).

First, the pattern inspection apparatus 1 performs the inspection-target image acquisition step (Step S1) that acquires two-dimensional electron-image data of a pattern formed on the substrate 4 by using the multiple primary electron beams 20. Specifically, the pattern inspection apparatus 1 operates in the following manner.

First, in a state where the multiple primary electron beams 20 are brought into focusing on a reference position on a surface of the substrate 4 by the electromagnetic lens 212 that is an objective lens, the stage 225 with the substrate 4 placed thereon is moved by the driving mechanism 9 under control of the stage control circuit 36. The stage control circuit 36 and the deflection control circuit 310 execute control of scanning an inspection region 41 of the substrate 4 for which a pattern defect is to be inspected with the multiple primary electron beams 20 along stripes 42 obtained by virtually dividing the inspection region 41 into a plurality of strips, as illustrated in a broken arrow in FIG. 4A. Although FIG. 4A illustrates the stripes 42 in a simplified manner, the actual stripes 42 have a shape in which the width of each stripe periodically varies as illustrated in FIG. 4B. In other words, the stripes 42 in FIG. 4B have a shape in which both ends in the second moving direction (that is, the Y-direction) of each stripe 42 come close to and are separated from a center C in the second moving direction of that stripe 42 alternately and periodically along the first moving direction (that is, the X-direction) in a repeated manner (that is, reduction and increase of each stripe width are repeated alternately). In FIG. 4B, one of two stripes 42 adjacent to each other in the second moving direction is illustrated with a solid line and the other is illustrated with a broken line. As illustrated in FIG. 4B, the stripes 42 adjacent to each other in the second moving direction are arranged to be the same as each other in a period with which approaching and separating of both ends in the second moving direction of each stripe 42 are repeated, but positions in those stripes 42, at which the approaching and the separating start, are shifted from each other in the first moving direction. That is, when the stripes 42 are viewed as extending in the first moving direction (the x-direction) (being laterally long) as illustrated in FIG. 4B, the stripes 42 adjacent to each other in the second moving direction (the y-direction) have shapes in which a varying period and a varying shape of one end in the second moving direction (upper ends) and the other end in the second moving direction (lower ends) are the same but varying phases are shifted. Further, the stripes 42 adjacent to each other in the second moving direction are arranged in such a manner that a pitch that is a distance between the centers C is smaller than the largest width of the stripes 42. That is, the stripes 42 adjacent to each other in the second moving direction are arranged to be spread all over the inspection region 41 without any gap or overlapping. That is, the inspection region 41 has a shape with no gap. Specifically, the stage control circuit 36 drives and controls the driving mechanism 9 in such a manner that the inspection region 41 is scanned with the multiple primary electron beams 20 along the stripes 42 (that is, along the x-direction). A direction along the stripes 42 is the first moving direction of the stage 225 and a direction perpendicular to the stripes 42 is the second moving direction of the stage 225. Further, for each of a plurality of scanning regions 43 forming each stripe 42, the deflection control circuit 310 controls the sub-deflector 214 to collectively deflect all the multiple primary electron beams 20 and scan each scanning region 43 with the multiple primary electron beams 20. The stage 225 may be moved by a step-and-repeat method in which, every time the scanning region 43 is changed, a settling time (that is, a scanning-standby time) is provided until a stage position becomes stable, or may be moved in a continuous moving method in which no settling time is provided every time the scanning region 43 is changed.

Figure 5:
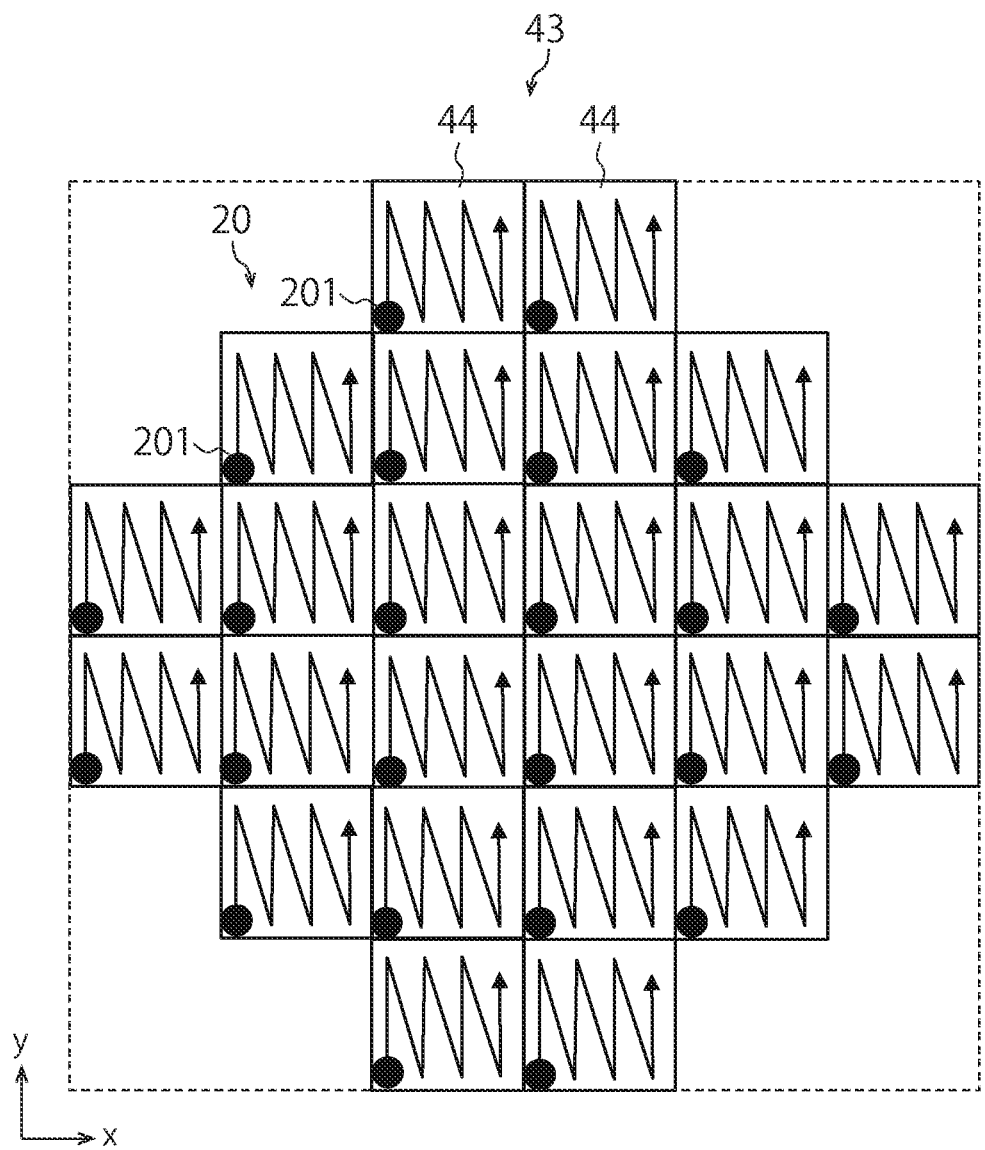
FIG. 5 is a plan view illustrating scanning of a scanning region in the inspection-target image acquisition step in the pattern inspection method according to the present embodiment.

FIG. 5 is a plan view illustrating scanning of the scanning region 43 in the inspection-target image acquisition step in the pattern inspection method according to the present embodiment. FIG. 5 illustrates the multiple primary electron beams 20 that include 24 beams 201 in total arranged in six rows×six columns in which beams around four corners are omitted. The scanning region 43 is a region of the inspection region 41 which can be scanned with the multiple primary electron beams 20 in one radiation of the multiple primary electron beams 20 (that is, in one shot).

The scanning region 43 is divided into a plurality of sub-scanning regions 44 each of which can be scanned with a corresponding one of the beams 201 forming the multiple primary electron beams 20. The same positions in the sub-scanning regions 44 are respectively scanned with the corresponding beams 201 forming the multiple primary electron beams 20. Scanning of each sub-scanning region 44 with the beam 201 is performed by collectively deflecting all the multiple primary electron beams 20 by the sub-deflector 214, as described before.

In collective deflection of the multiple primary electron beams 20 by the sub-deflector 214, moving directions and moving amounts of the respective beams 201 are the same as each other. Accordingly, the multiple primary electron beams 20 always maintain a state where those are arranged in a square lattice. In other words, the y-coordinates of the beams 201 adjacent to each other in the x-direction are kept the same as each other, and the x-coordinates of the beams 201 adjacent to each other in the y-direction are kept the same as each other.

Further, when the multiple primary electron beams 20 are viewed as a whole, beams around four corners are omitted. In other words, the beam 201, that is, the scanning region 43 is not arranged around four corners of a rectangular region (see a broken-line portion in FIG. 5) surrounded by line segments along the y-direction which are circumscribed with the sub-scanning regions 44 at both ends in the x-direction and line segments along the x-direction which are circumscribed with the sub-scanning regions 44 at both ends in the y-direction.

By entirely scanning each sub-scanning region 44 with a corresponding one of the beams 201 forming the multiple primary electron beams 20 described above, the scanning region 43 is entirely scanned. This scanning is repeated for all the scanning regions 43 on the stripe 42 while the stage 225 is moved.

Figure 6:
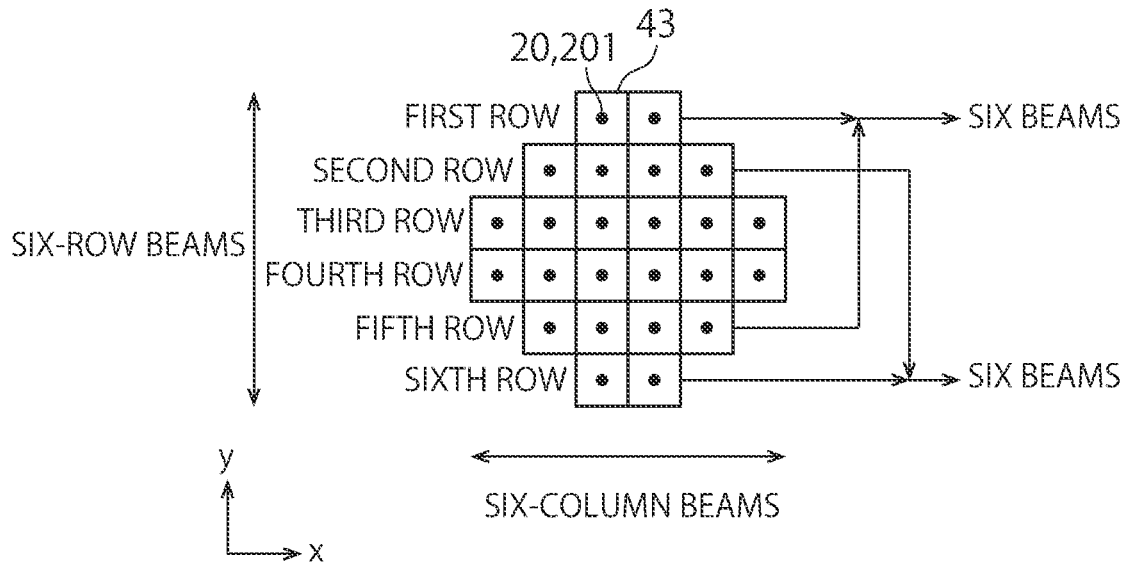
FIG. 6 is an explanatory diagram of an arrangement of multiple primary electron beams in the pattern inspection method according to the present embodiment.

FIG. 6 is an explanatory diagram of an arrangement of the multiple primary electron beams 20 in the pattern inspection method according to the present embodiment. In order to scan the inspection region 41 without excess or deficiency, the multiple primary electron beams 20 are arranged in accordance with the arrangement of the holes 251 in the shaping-aperture array substrate 25 in such a manner that the sum of the number of beams in the K-th row and the number of beams in (N−A+K)-th row is M.

The column-arranged direction in the arrangement of the multiple primary electron beams 20 is parallel to the first moving direction of the stage 225, that is, the x-direction. The row-arranged direction in the arrangement of the multiple primary electron beams 20 is parallel to the second moving direction of the stage 225, that is, the y-direction. M is the number of columns of the beams 201 forming the multiple primary electron beams 20 and is six in the example of FIG. 6. N is the number of rows of the beams 201 forming the multiple primary electron beams 20 and is six in the example of FIG. 6. A is ½ of the number of rows in which the number of beams in the column-arranged direction is smaller than M, and is two in the example of FIG. 6. K is any integer that is equal to or larger than one and is equal to or smaller than A, and is one or two in the example of FIG. 6.

In more detail, as illustrated in FIG. 6, the sum of two that is the number of beams in the K-th row where k=1 and four that is the number of beams in the (N−A+K)-th row where (N−A+K)=(6−2+1)=5 is six, that is, M. Further, the sum of four that is the number of beams in the K-th row where k=2 and two that is the number of beams in the (N−A+K)-th row where (N−A+K)=(6−2+2)=6 is six, that is, M.

In addition, in the example of FIG. 6, for the multiple primary electron beams 20, the number of beams in the column-arranged direction and that in the row-arranged direction are even numbers. Furthermore, the multiple primary electron beams 20 are arranged in 180° rotational symmetry.

Figure 7:
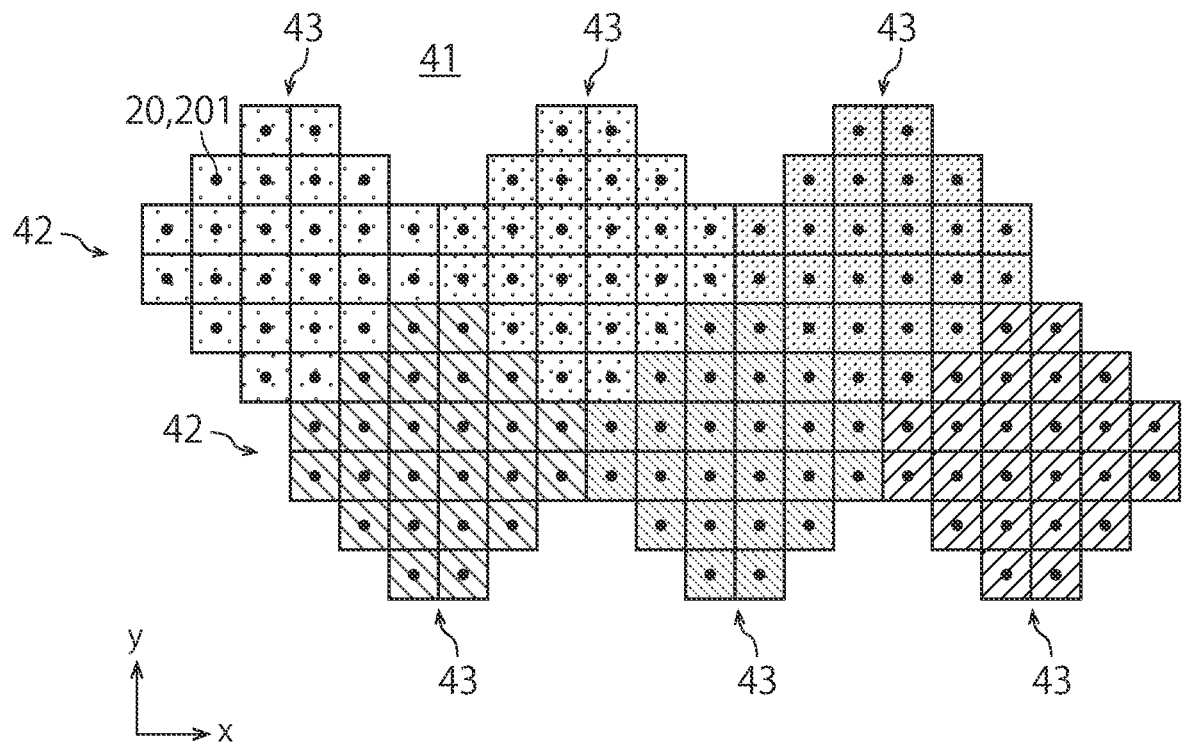
FIG. 7 is a plan view illustrating a state where an inspection region is scanned with the multiple primary electron beams without excess or deficiency in the pattern inspection method according to the present embodiment.

FIG. 7 is a plan view illustrating a state where the inspection region 41 is scanned with the multiple primary electron beams 20 without excess or deficiency in the pattern inspection method according to the present embodiment. FIG. 7 illustrates the scanning regions 43 that form each of the two stripes 42 adjacent to each other in the y-direction. Each stripe 42 has a shape in which the width varies periodically, as described with reference to FIG. 4B.

According to the multiple primary electron beams 20 arranged as illustrated in FIG. 6, it is possible to scan the entire scanning regions 43 that are spread in the inspection region 41 without any gap or overlapping, as illustrated in FIG. 7. Accordingly, the inspection region 41 can be scanned without excess or deficiency, and therefore accuracy and efficiency of inspection can be improved.

In order to spread the scanning regions 43 all over the inspection region 41, the scanning regions 43 are shifted from each other in the x-direction between the stripes 42 adjacent to each other in the y-direction, as illustrated in FIG. 7. This shifting of the positions in the x-direction of the scanning regions 43 can be performed by shifting the stage position, for example. The position in the x-direction of the scanning region 43 can be adjusted by starting the scan at a position after the stage 225 is shifted in a step-and-repeat method, and by shifting a start timing of the scan in a continuous moving method, for example.

Radiation of the multiple primary electron beams 20 arranged in the above-described manner to desired positions on the substrate 4 causes emission of the multiple secondary electron beams 300 including backscattered electrons corresponding to the multiple primary electron beams 20 from the substrate 4. The multiple secondary electron beams 300 emitted from the substrate 4 travel to the beam separator 216 and are then deflected diagonally upward. The multiple secondary electron beams 300 deflected diagonally upward are deflected by the deflector 217 and are projected onto the multidetector 224. The multidetector 224 detects the projected multiple secondary electron beams 300 as two-dimensional electron-image data. The detected two-dimensional electron-image data is output to the detection circuit 6 in the order of detection. In the detection circuit 6, the two-dimensional electron-image data that is analog data is converted to digital data by an A/D converter (not illustrated) and is then stored in the pattern memory 7.

In this manner, the pattern inspection apparatus 1 acquires the two-dimensional electron-image data of a pattern formed on the substrate 4 as inspection-target image data. The acquired inspection-target image data is transferred to the comparison circuit 34 together with information indicating each position from the position detection circuit 33. The comparison circuit 34 temporarily stores therein the inspection-target image data transferred thereto.

The reference image generation step (Step S2) is performed after the inspection-target image acquisition step (Step S1) or in parallel to the inspection-target image acquisition step (Step S1). In the reference image generation step (Step S2), the reference-image generation circuit 35 generates a reference image corresponding to an inspection-target image. Specifically, the reference-image generation circuit 35 generates reference image data by reading out design data that is the base for forming a pattern on the substrate 4 from the storage device 311, converting the read design data to binary or multi-valued image data, and performing appropriate filtering for the converted image data. The reference-image generation circuit 35 then outputs the generated reference image data to the comparison circuit 34. The comparison circuit 34 temporarily stores therein the output reference image data.

The alignment step (Step S3) is performed after the inspection-target image acquisition step (Step S1) and the reference image generation step (Step S2).

In the alignment step (Step S3), the comparison circuit 34 reads out the inspection-target image data and the reference image data that are stored therein and performs alignment for both the data.

After the alignment step (Step S3), the comparison circuit 34 performs the comparison step (Step S4). That is, the comparison circuit 34 compares the inspection-target image data and the reference image data after being subjected to alignment with each other to determine whether there is a defect such as a shape defect. For example, the comparison circuit 34 determines that there is a defect when a gradation value difference between the inspection-target image data and the reference image data is larger than a threshold for determination, and outputs the determination result to the storage device 311, the monitor 312, the memory 313 or the printer 314.

Inspection is not limited to the die to database inspection described above and the die to die inspection may be performed. In a case of performing the die to die inspection, it suffices to compare images of the scanning regions 43 in which the same pattern is formed with each other and determine whether there is a defect based on the comparison result. Further, in a case of using a semiconductor substrate as the substrate 4, it suffices to perform inspection for each of a plurality of chips on the semiconductor substrate which are arranged in an array along the x-direction and the y-direction, for example. In inspection for each chip, it suffices to virtually divide the chip into a plurality of stripes along the x-direction and to scan the chip with the multiple primary electron beams 20 along the stripes, as in the case of the mask substrate for exposure.

As described above, according to the present embodiment, it is possible to entirely scan the scanning regions 43 that are spread in the inspection region 41 without any gap or overlapping by using the multiple primary electron beams 20 arranged in a square lattice in which beams around four corners are omitted as described above. Accordingly, the inspection region 41 can be scanned without excess or deficiency, so that accuracy and efficiency of inspection can be improved.

Further, according to the present embodiment, the multiple primary electron beams 20 are arranged in such a manner that the sum of the number of beams in the K-th row and the number of beams in the (N−A+K)-th row is M. Thus, it is possible to surely scan all the scanning regions 43 that are spread in the inspection region 41 without any gap or overlapping.

Furthermore, according to the present embodiment, it is possible to easily arrange the multiple primary electron beams 20 by arranging the multiple primary electron beams 20 in 180° rotational symmetry.

In addition, according to the present embodiment, the arrangement of the multiple primary electron beams 20 with which the inspection region 41 can be scanned without excess or deficiency can be simply achieved by the arrangement of the holes 251 in the shaping-aperture array substrate 25. The arrangement of the multiple primary electron beams 20 described above may be achieved by control of deflection of the multiple primary electron beams 20 in addition to or in place of the arrangement of the holes 251 in the shaping-aperture array substrate 25.

(Modification)

Next, modifications of the arrangement of the multiple primary electron beams 20 are described. FIGS. 8A to 8K are plan views illustrating modifications of the arrangement of the multiple primary electron beams 20. In FIGS. 8A to 8K, the arrangement of the multiple primary electron beams 20 is illustrated as the arrangement of the sub-scanning regions 44. A corresponding one of beams 201 of the multiple primary electron beams 20 is assigned to each of the sub-scanning regions 44, although not illustrated.

Although the description has been made to 24 multiple primary electron beams 20 in total in FIGS. 5 to 7, the number of the multiple primary electron beams 20 is not limited to 24 as long as it is possible to scan all the scanning regions 43 that are spread in the inspection region 41 without any gap or overlapping with the multiple primary electron beams 20.

Figure 8:
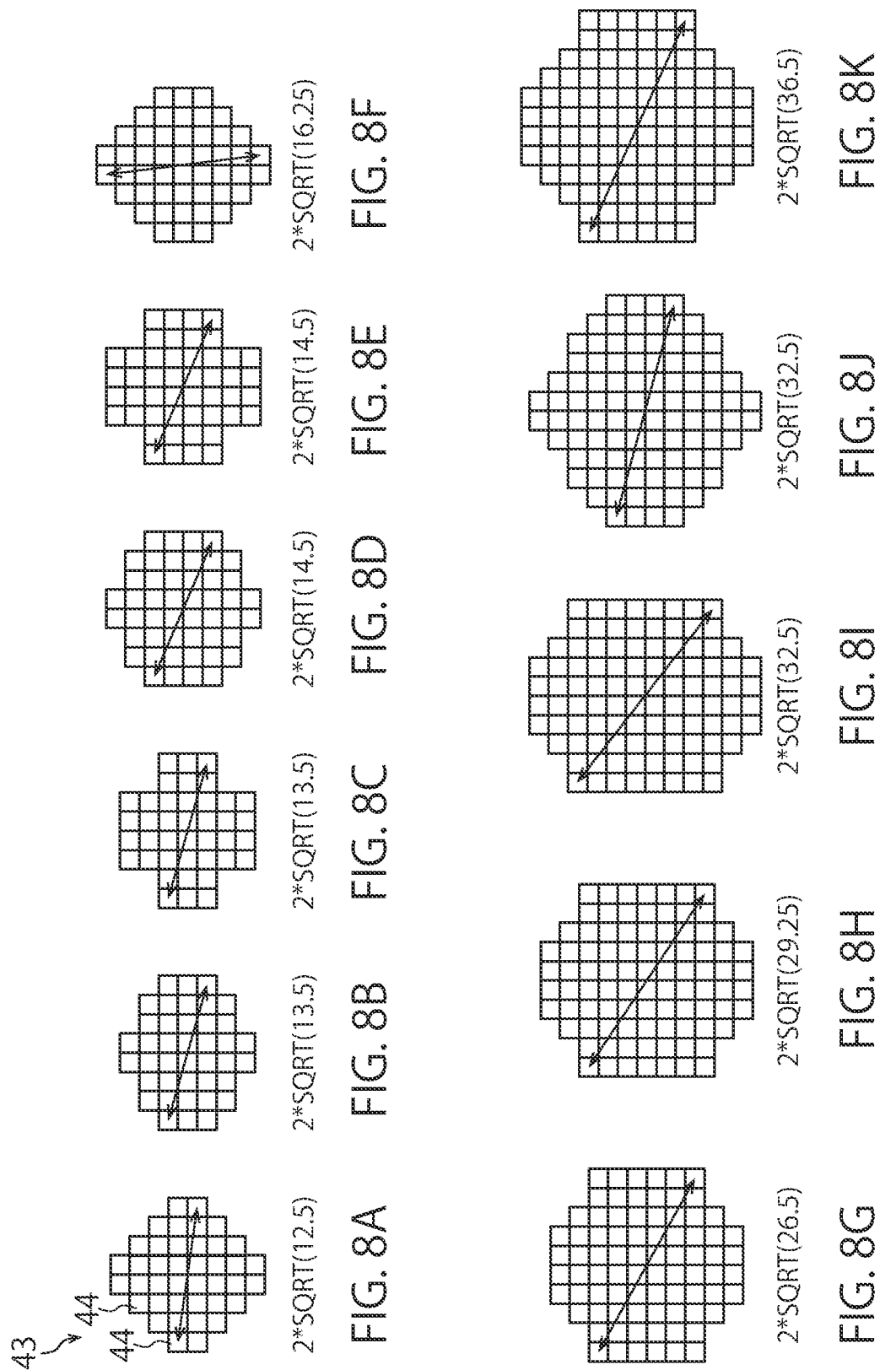
FIGS. 8A to 8K are plan views illustrating modifications of the arrangement of the multiple primary electron beams.

For example, the number of the multiple primary electron beams 20 may be 40 as illustrated in FIGS. 8A to 8C. 2*SQRT(12.5) in FIG. 8A is a distance between farthest beams illustrated with a bidirectional arrow in FIG. 8A, which is represented as a relative value when it is assumed that the length of each side of the sub-scanning region 44 in the form of a square is 1 (this is also applied to the following description). As this distance is larger, the field of view (FOV) is larger. In the examples of FIGS. 8B and 8C, the distance between the farthest beams is 2*SQRT(13.5). Therefore, the field of view in FIG. 8A is smaller than those in FIGS. 8B and 8C.

Further, the number of the multiple primary electron beams 20 may be 60 as illustrated in FIGS. 8D to 8F, 80 as illustrated in FIG. 8G, 90 as illustrated in FIG. 8H, or 100 as illustrated in FIG. 8I. Alternatively, the number of the multiple primary electron beams 20 may be 96 as illustrated in FIG. 8J or 108 as illustrated in FIG. 8K.

Figure 9:
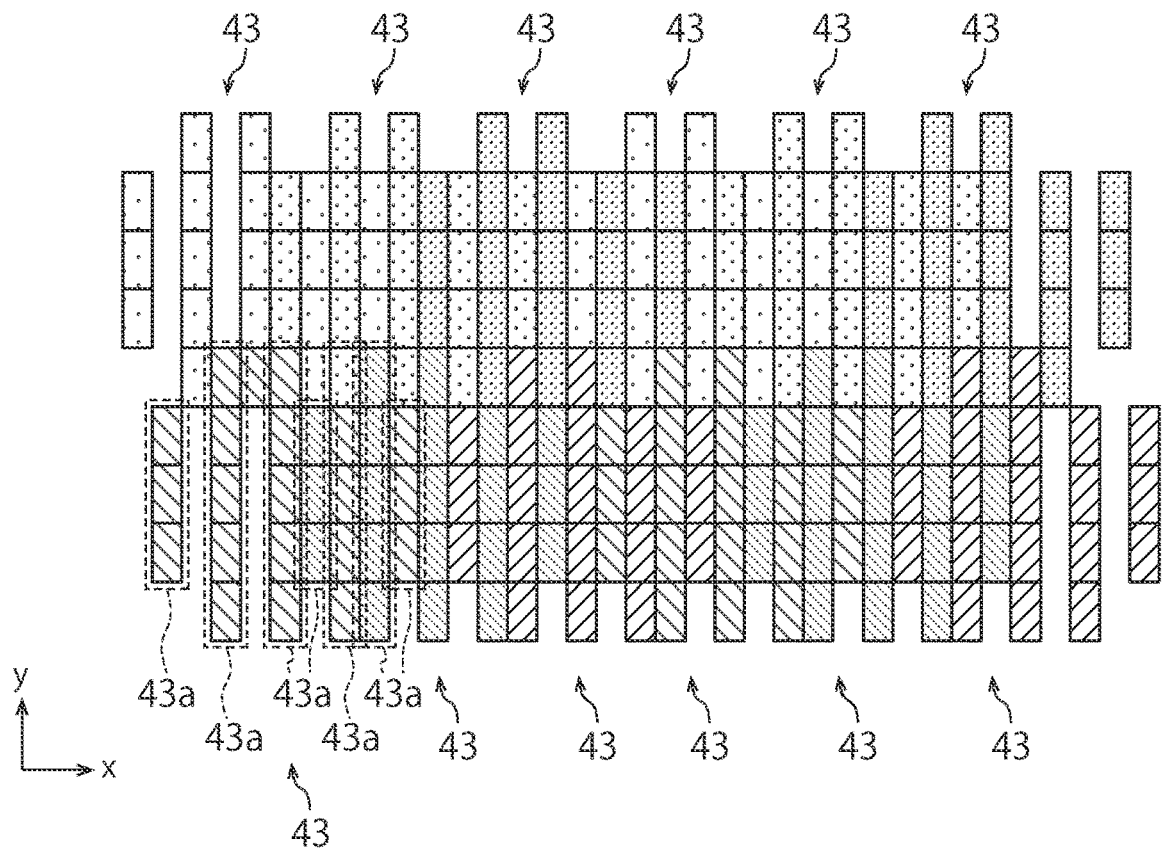
FIG. 9 is a plan view illustrating another modification of the arrangement of the multiple primary electron beams.

FIG. 9 is a plan view illustrating another modification of the arrangement of the multiple primary electron beams 20. Although the description has been made to the example in which the scanning region 43 is one continuous region divided into the mutually adjacent sub-scanning regions 44 in FIGS. 5 to 7, the scanning region 43 is not limited to one continuous region as long as it is possible to scan all the scanning regions 43 that are spread in the inspection region 41 without any gap or overlapping with the multiple primary electron beams 20. For example, as illustrated in FIG. 9, the scanning region 43 may be divided into a plurality of divided regions 43a with a gap therebetween in the first moving direction of the stage 225 (that is, the x-direction). In the example of FIG. 9, a gap between the adjacent divided regions 43a is embedded with the divided region 43a of another scanning region 43 that is adjacent to the gap in the x-direction.

Figure 10:
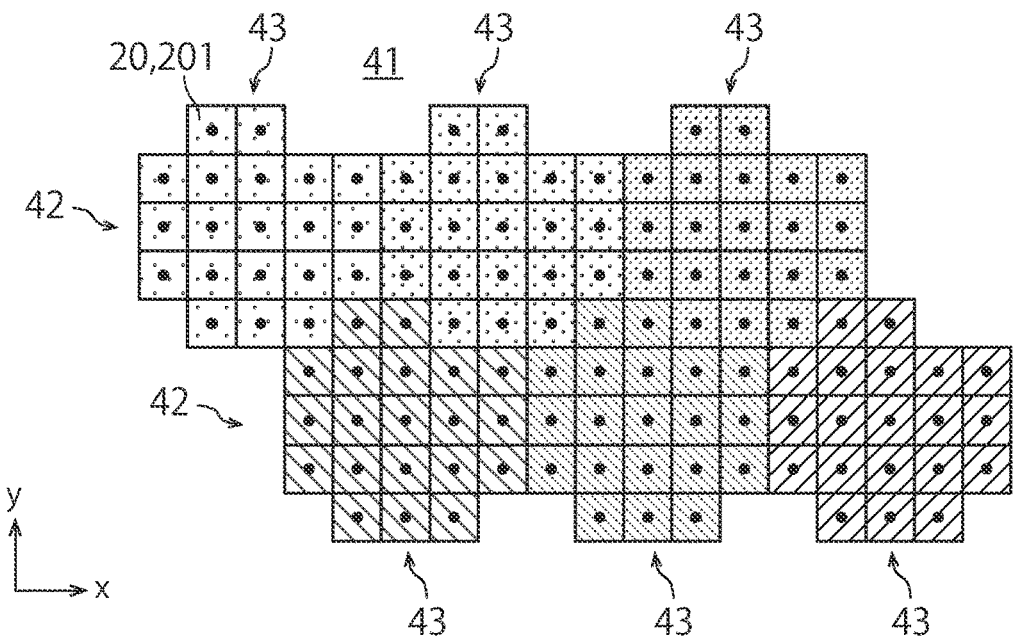
FIG. 10 is a plan view illustrating still another modification of the arrangement of the multiple primary electron beams.

FIG. 10 is a plan view illustrating still another modification of the arrangement of the multiple primary electron beams 20. In FIG. 7, the example in which the multiple primary electron beams 20 are arranged in 180° rotational symmetry has been described. However, as illustrated in FIG. 10, the multiple primary electron beams 20 may be arranged not in 180° rotational symmetry, as long as all the scanning regions 43 that are spread in the inspection region 41 without any gap or overlapping can be scanned with the multiple primary electron beams 20.

At least a part of the pattern inspection apparatus 1 may be constituted by hardware or software. When the apparatus is constituted by software, it is possible to configure that a program for realizing at least a part of the functions of the pattern inspection apparatus 1 is held in a recording medium such as a flexible disk or a CD-ROM and a computer is caused to read and execute the program. The recording medium is not limited to a detachable one such as a magnetic disk or an optical disk, and a stationary recording medium such as a hard disk device or a memory may be also applicable.

The embodiments described above have been presented by way of example only and are not intended to limit the scope of the invention. The embodiments can be implemented in a variety of other forms, and various omissions, substitutions and changes can be made without departing from the spirit of the invention. The embodiments and modifications thereof are included in the scope of invention described in the claims and their equivalents as well as the scope and the spirit of the invention.

The invention claimed is:

1. A multiple electron-beam image acquisition apparatus radiating multiple primary electron beams onto a substrate and acquiring an image of multiple secondary electron beams emitted from the substrate, the apparatus comprising:
a beam arrangement portion configured to arrange the multiple primary electron beams on the substrate, wherein
the beam arrangement portion arranges the multiple primary electron beams in a square lattice along a first moving direction of a stage allowing the substrate to be placed thereon and a second moving direction perpendicular to the first moving direction in a state where, when the multiple primary electron beams are viewed as a whole, beams around four corners of the square lattice are omitted, and
an arrangement state of the multiple primary electron beams is a state where, when the first moving direction is defined as a column-arranged direction and the second moving direction is defined as a row-arranged direction, a sum of number of beams in a K-th row and number of beams in a (N−A+K)-th row is M, where
M is a maximum number of columns of beams forming the multiple primary electron beams,
N is number of rows of the beams forming the multiple primary electron beams,
A is ½ of number of rows in which number of beams in the column-arranged direction is smaller than M, and
K is any integer that is equal to or larger than one and is equal to or smaller than A, wherein
the multiple electron-beam image acquisition apparatus is configured to scan an inspection region of the substrate along a plurality of stripes with the multiple primary electron beams, the stripes being obtained by virtually dividing the inspection region, the stripes extending along the first moving direction, the stripes having no gaps, being non-overlapping, and being adjacent to each other in the second moving direction,
each of the stripes having a symmetrical shape in the second moving direction, the symmetrical shape in the second moving direction having a varying period and a varying shape in the second moving direction, the symmetrical shapes of adjacent stripes being shifted from each other in a phase, and the inspection region has a shape with no gap,
each of the stripes includes a plurality of scanning regions aligned in the first moving direction, each scanning region included in the same stripe being adjacent to an edge of an adjacent scanning region in the same stripe, and
the stage is moved in a continuous moving method.

2. The multiple electron-beam image acquisition apparatus of claim 1, wherein the beam arrangement portion arranges the multiple primary electron beams in 180° rotational symmetry.

3. The multiple electron-beam image acquisition apparatus of claim 1, wherein
the beam arrangement portion includes an aperture member having a plurality of openings formed therein, and
the openings are provided in line in a square lattice along the first moving direction and the second moving direction and, when the openings are viewed as a whole, openings around four corners of the square lattice are omitted.

4. The multiple electron-beam image acquisition apparatus of claim 2, wherein
the beam arrangement portion includes an aperture member having a plurality of openings formed therein, and
the openings are provided in line in a square lattice along the first moving direction and the second moving direction and, when the openings are viewed as a whole, openings around four corners of the square lattice are omitted.

5. A multiple electron-beam image acquisition method radiating multiple primary electron beams onto a substrate and acquiring an image of multiple secondary electron beams emitted from the substrate, the method comprising:

arranging the multiple primary electron beams on the substrate in a square lattice along a first moving direction of a stage allowing the substrate to be placed thereon and a second moving direction perpendicular to the first moving direction in a state where, when the multiple primary electron beams are viewed as a whole, beams around four corners of the square lattice are omitted, wherein an arrangement state of the multiple primary electron beams is a state where, when the first moving direction is defined as a column-arranged direction and the second moving direction is defined as a row-arranged direction, a sum of number of beams in a K-th row and number of beams in a (N−A+K)-th row is M, where M is a maximum number of columns of beams forming the multiple primary electron beams, N is number of rows of the beams forming the multiple primary electron beams, A is ½ of number of rows in which number of beams in the column-arranged direction is smaller than M, and K is any integer that is equal to or larger than one and is equal to or smaller than A, wherein the multiple electron-beam image acquisition method further comprising scanning an inspection region of the substrate along a plurality of stripes with the multiple primary electron beams, the stripes being obtained by virtually dividing the inspection region, the stripes extending along the first moving direction, the stripes having no gaps, being non-overlapping, and being adjacent to each other in the second moving direction, each of the stripes having a symmetrical shape in the second moving direction, the symmetrical shape in the second moving direction having a varying period and a varying shape in the second moving direction, the symmetrical shapes of adjacent stripes being shifted from each other in a phase, and the inspection region has a shape with no gap, each of the stripes includes a plurality of scanning regions aligned in the first moving direction, each scanning region included in the same stripe being adjacent to an edge of an adjacent scanning region in the same stripe, and the stage is moved in a continuous moving method.

6. The multiple electron-beam image acquisition method of claim 5, comprising arranging the multiple primary electron beams in 180° rotational symmetry.

7. The multiple electron-beam image acquisition method of claim 5, wherein arranging of the multiple primary electron beams is performed by using an aperture member having a plurality of openings formed therein, and the openings are provided in line in a square lattice along the first moving direction and the second moving direction and, when the openings are viewed as a whole, openings around four corners of the square lattice are omitted.

8. The multiple electron-beam image acquisition method of claim 6, wherein arranging of the multiple primary electron beams is performed by using an aperture member having a plurality of openings formed therein, and the openings are provided in line in a square lattice along the first moving direction and the second moving direction and, when the openings are viewed as a whole, openings around four corners of the square lattice are omitted.

9. The multiple electron-beam image acquisition apparatus of claim 1, wherein the multiple electron-beam image acquisition apparatus is configured to scan each of the stripes of the inspection region individually, moving to adjacent stripes in a serpentine pattern along the second moving direction.

10. The multiple electron-beam image acquisition method of claim 5, wherein the scanning includes scanning each of the stripes of the inspection region individually, moving to adjacent stripes in a serpentine pattern along the second moving direction.

11. The multiple electron-beam image acquisition method of claim 5, wherein a number of beams in adjacent K-th rows is different.

12. The multiple electron-beam image acquisition apparatus of claim 1, wherein a number of beams in adjacent K-th rows is different.

* * * * *